United States Patent
Yoo et al.

(10) Patent No.: US 8,809,988 B2
(45) Date of Patent: Aug. 19, 2014

(54) LOW LEAKAGE AND/OR LOW TURN-ON VOLTAGE SCHOTTKY DIODE

(75) Inventors: Ji-Hyoung Yoo, Cupertino, CA (US); Martin E. Garnett, Los Gatos, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 391 days.

(21) Appl. No.: 13/061,756

(22) PCT Filed: Sep. 3, 2009

(86) PCT No.: PCT/US2009/055922
§ 371 (c)(1),
(2), (4) Date: Mar. 2, 2011

(87) PCT Pub. No.: WO2010/028171
PCT Pub. Date: Mar. 11, 2010

(65) Prior Publication Data
US 2011/0156199 A1    Jun. 30, 2011

Related U.S. Application Data

(60) Provisional application No. 61/094,258, filed on Sep. 4, 2008.

(51) Int. Cl.
*H01L 29/40* (2006.01)

(52) U.S. Cl.
USPC .................... 257/485; 257/473; 257/E29.339

(58) Field of Classification Search
CPC ............ H10L 29/0619; H10L 29/7806; H10L 29/872; H10L 29/66143
USPC .................... 257/143, 144, 152, 162, E27.04, 257/E29.338, E21.359, 155, 485, 453, 473, 257/474, 471, 449, 454
See application file for complete search history.

(56) References Cited

U.S. PATENT DOCUMENTS

| | | | | |
|---|---|---|---|---|
| 5,614,755 | A * | 3/1997 | Hutter et al. | 257/471 |
| 7,064,407 | B1 | 6/2006 | Mallikarjunaswamy | |
| 2006/0246670 | A1 | 11/2006 | Khemka et al. | |
| 2007/0247213 | A1* | 10/2007 | Kapoor | 327/534 |
| 2008/0277668 | A1* | 11/2008 | Okuno et al. | 257/77 |
| 2008/0296722 | A1* | 12/2008 | Girdhar et al. | 257/476 |
| 2009/0057770 | A1* | 3/2009 | Pang | 257/369 |
| 2009/0236679 | A1* | 9/2009 | Chiang et al. | 257/483 |

FOREIGN PATENT DOCUMENTS

GB    2184599 A  *  6/1987  .............. H01L 29/91

OTHER PUBLICATIONS

International Search Report and Written Opinion; Application No. PCT/US2009/055922; Mailing Date: Oct. 22, 2009, 9 pages.

* cited by examiner

*Primary Examiner* — Cuong Q Nguyen
*Assistant Examiner* — Yosef Gebreyesus
(74) *Attorney, Agent, or Firm* — Perkins Coie LLP

(57) ABSTRACT

A Schottky diode and a method of manufacturing the Schottky diode are disclosed. The Schottky diode has an N-well or N-epitaxial layer with a first region, a second region substantially adjacent to an electron doped buried layer that has a donor electron concentration greater than that of the first region, and a third region substantially adjacent to the anode that has a donor electron concentration that is less than that of the first region. The second region may be doped with implanted phosphorus and the third region may be doped with implanted boron.

16 Claims, 17 Drawing Sheets

US 8,809,988 B2

LOW LEAKAGE AND/OR LOW TURN-ON VOLTAGE SCHOTTKY DIODE

CROSS REFERENCE TO RELATED APPLICATION(S)

This application is a U.S. National Phase of International Patent Application No. PCT/US09/55922, filed Sep. 3, 2009 and titled LOW LEAKAGE AND/OR LOW TURN-ON VOLTAGE SCHOTTKY DIODE, which is related to and claims the benefit of U.S. Provisional Patent Application No. 61/094,258, filed Sep. 4, 2008 and titled PHOSPHOROUS AND BORON IMPLANTED SCHOTTKY DIODE; the disclosure of each of these applications is incorporated herein by reference in its entirety.

TECHNICAL FIELD

The present disclosure is directed to semiconductor devices and processes, for example, to Schottky diodes and to the manufacturing of Schottky diodes.

BACKGROUND

Schottky diodes are employed in many applications due to their relatively low turn-on voltage (low forward voltage drop), and relatively fast switching times. Typical Schottky diodes have generally employed either low barrier height metals (e.g., titanium (Ti), titanium nitride (TiN), titanium silicide (TiSi2), cobalt (Co), cobalt silicide ($CoSi_2$), etc.) or high barrier height metals (e.g., platinum (Pt), platinum silicide (PtSi), etc.) to form contacts over N-type silicon.

In many applications, low barrier height metal Schottky diodes have lower forward voltage drops than high barrier height metal Schottky diodes and are able to carry more current through a diode of a given size. However, low barrier height metal Schottky diodes generally allow greater current leakage when reverse biased (reverse leakage current) as compared to high barrier height metal Schottky diodes.

Various techniques have been employed to improve the leakage current characteristics in low barrier height metal Schottky diodes, such as to use relatively lightly doped N-wells. However, more lightly doped N-well Schottky diodes generally have higher resistances, so that their forward currents at a given bias are less than for a Schottky diode having a more highly doped N-well.

In certain applications it may be desirable for a Schottky diode to have a relatively small turn-on voltage, or forward voltage drop, and yet have a relatively small reverse leakage current.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative size depicted.

For a better understanding of the present invention, reference will be made to the following Detailed Description, which is to be read in association with the accompanying drawings, wherein.

DETAILED DESCRIPTION

The following description provides specific details for a thorough understanding of, and enabling description for, various embodiments of the technology. One skilled in the art will understand that the technology may be practiced without many of these details. In some instances, well-known structures and functions have not been shown or described in detail to avoid unnecessarily obscuring the description of the embodiments of the technology. It is intended that the terminology used in the description presented below be interpreted in its broadest reasonable manner, even though it is being used in conjunction with a detailed description of certain embodiments of the technology. Although certain terms may be emphasized below, any terminology intended to be interpreted in any restricted manner will be overtly and specifically defined as such in this Detailed Description section. Likewise, terms used to describe a position or location, such as "under," "below," "over," "above," "right," "left," and similar, are used relative to the orientation of the illustrated embodiments and are intended to encompass similar structures when rotated into the illustrated anode/cathode up position. The term "based on" or "based upon" is not exclusive and is equivalent to the term "based, at least in part, on" and includes being based on additional factors, some of which are not described herein. References in the singular are made merely for clarity of reading and include plural references unless plural references are specifically excluded. The term "or" is an inclusive "or" operator and is equivalent to the term "and/or" unless specifically indicated otherwise. In the description that follows, the scope of the term "some embodiments" is not to be so limited as to mean more than one embodiment, but rather, the scope may include one embodiment, more than one embodiment, or perhaps all embodiments.

A Schottky diode and a method of manufacturing the Schottky diode are disclosed. The Schottky diode has an N-well or N-epitaxial layer with a first region, a second region substantially adjacent to an electron doped buried layer that has a donor electron concentration greater than that of the first region, and a third region substantially adjacent to the anode that has a donor electron concentration that is less than that of the first region. The second region may be doped with implanted phosphorus, and the third region may be doped with implanted boron.

Figure 1A:
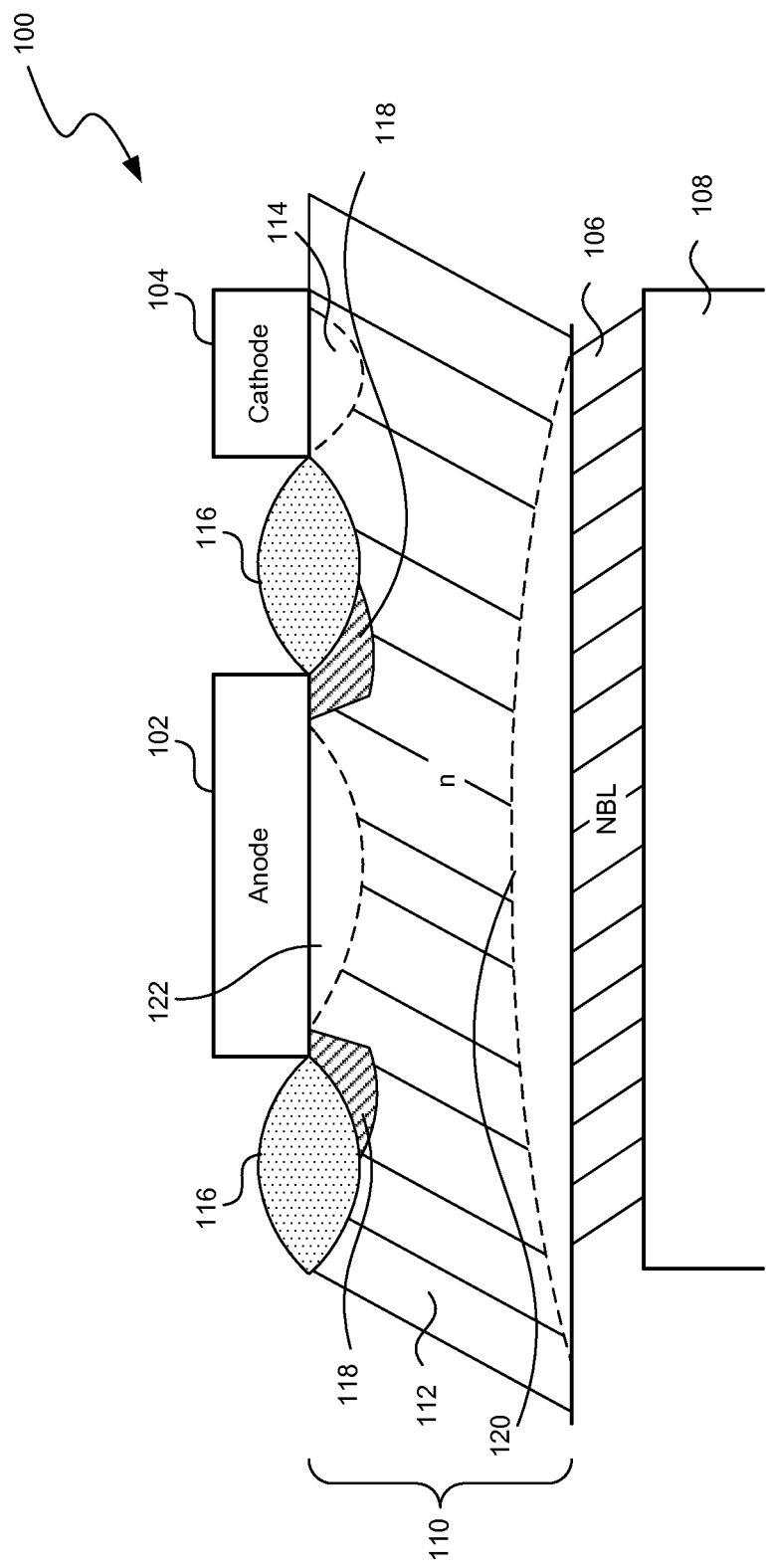
FIGS. 1A, 2A, 3A, and 4A are cross-sectional views of embodiments of Schottky diodes.
Figure 1B:
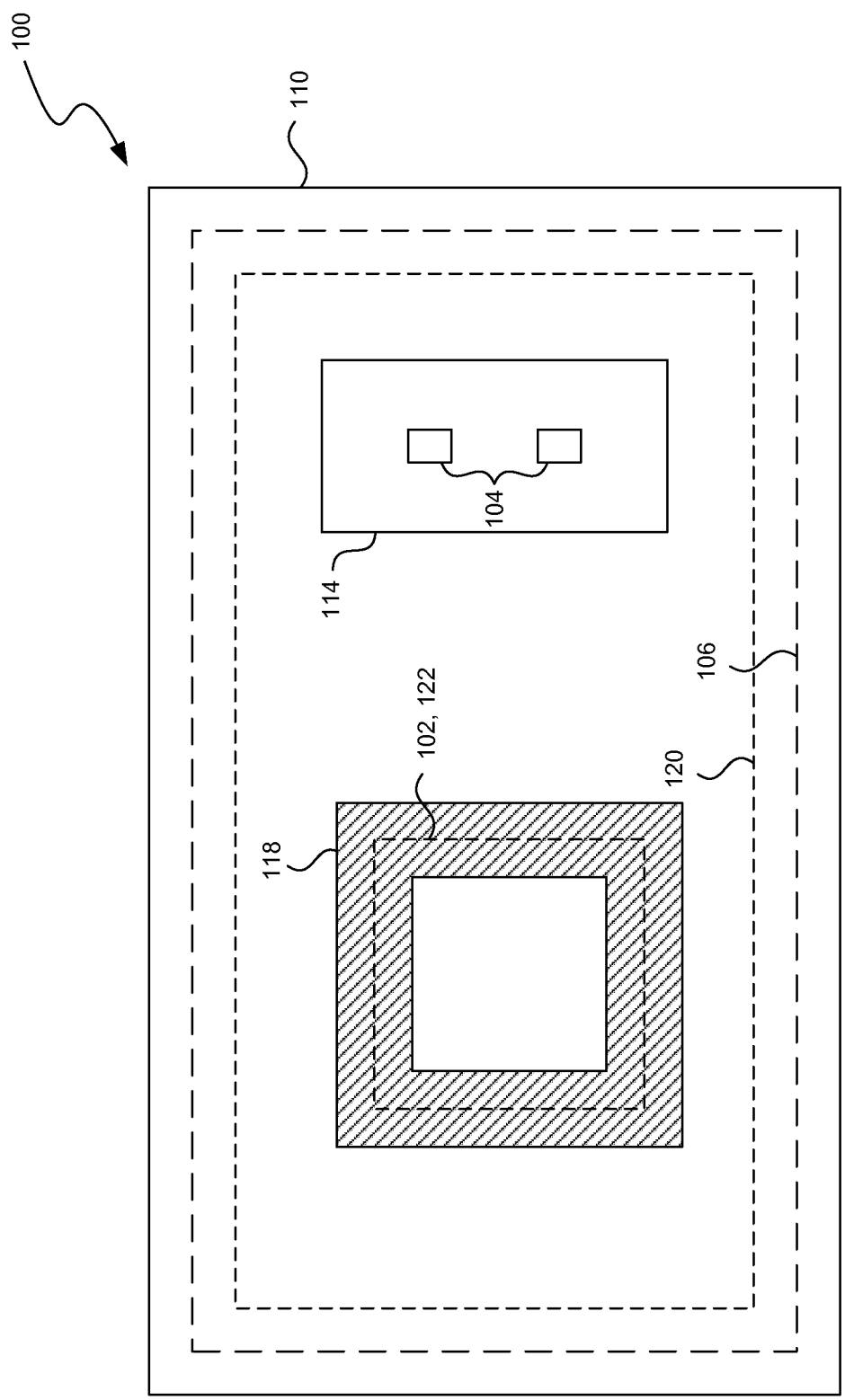
FIGS. 1B, 2B, 3B, and 4B are plan views of the respective Schottky diodes of FIGS. 1A, 2A, 3A, and 4A.

FIGS. 1A and 1B respectively illustrate a cross section and a plan view of a Schottky diode 100. Schottky diode 100 includes anode 102, cathode 104, electron donor doped buried layer 106, substrate 108, and N-well 110. Schottky diode 100 may be configured as a relatively low voltage drop and relatively low leakage current Schottky diode.

For some embodiments, anode 102 and/or cathode 104 may include or be formed of a low barrier height metal such as titanium (Ti), titanium nitride (TiN), titanium silicide ($TiSi_2$), cobalt (Co), or cobalt silicide ($CoSi_2$), and/or the like through a metallization or similar process. As one example, anode 102 includes a Ti/TiN salicide formed with the underlying silicon (e.g., region 122 and/or bulk 112) into a rectifying contact, and cathode 104 includes a Ti/TiN salicide formed with the underlying silicon (e.g., N+ region 114) into an ohmic contact. Anode 102 and cathode 104 may have any suitable geometric form factors. For example, a cathode 104 may form an annulus around anode 102. (Not shown.)

As shown in FIG. 1A, electron donor doped buried layer 106 is substantially adjacent to substrate 108 and region 120 of N-well 110. In typical embodiments, electron donor doped buried layer 106 has a donor electron concentration greater than that of bulk 112 of N-well 110 and functions to provide a relatively lower resistance current path between anode 102 and cathode 104 than through N-well 110. Electron donor doped buried layer 106 may also be referred to as an N-doped buried layer (NBL) and may be an NBL as typically formed by a bipolar complementary metal oxide semiconductor (BiCMOS) process.

For the illustrated embodiment, substrate 108 is any P-type substrate. Any suitable substrate may be employed.

As shown, N-well 110 includes bulk 112, N+ region 114, dielectric 116, region 118, region 120, and region 122. Bulk 112 of N-well 110 may have an electron concentration suitable for typical complementary metal oxide semiconductor (CMOS) technology. As discussed in greater detail below, region 120 may be doped to a higher electron concentration than bulk 112, and region 122 may be doped with hole donors so that, while region 122 is an N-type semiconductor, region 122 has an electron concentration less than that of bulk 112.

Stated differently, N-well 110 may be thought of as having multiple N-type regions including: bulk 112; N+ region 114 having an electron concentration greater than the electron concentration of bulk 112; region 120 substantially adjacent to electron donor doped buried layer 106 (e.g., adjacent to within semiconductor process tolerances) and having an electron concentration greater than the electron concentration of bulk 112; and region 122 having an electron concentration less than the electron concentration of bulk 112.

As one example, the formation of N-well 110 may include implanting phosphorous into intrinsic silicon with an implantation flux of about $5 \times 10^{12}/cm^2$ at an energy of about 70 KeV. However, other concentration and energy levels may be employed. In addition, further process steps may then be employed to form N+ region 114, dielectric 116, region 118, region 120, and region 122. Although described as an N-well, an N-type epitaxial layer, such as a constant concentration N-type epitaxial layer, may be suitably employed in lieu of an N-well.

N+ region 114 is positioned substantially adjacent to the cathode (e.g., under cathode 104) and has a donor electron concentration greater than that of bulk 112. For example, N+ region 114 may be relatively heavily doped as conventional Schottky N+ levels to enable an ohmic connection with cathode 104. As another example, N+ region 114 may be doped at typical N+ concentrations for N-type metal oxide semiconductor (NMOS) source or drain regions or at typical N+ concentrations for NPN transistor emitter, collector, or pickup regions. However, N+ region 114 may be doped at any suitable level.

As shown, dielectric 116 is formed in an annular configuration around anode 102 and may function to provide electrical isolation between anode 102 and cathode 104, as well as perhaps other components. (Not shown.) In at least one embodiment, dielectric 116 is a field oxide that is defined by the area between anode 104 and N+ region 114. However, any other suitable dielectric material or shape may be employed, or dielectric 116 may be omitted.

For some embodiments, region 118 is a P-type region formed in an annular configuration around anode 102. For example, region 118 may include a relatively lightly doped P+, P-base, or P-well formed as a guardring around anode 102.

A breakdown voltage of Schottky diode 100 may be based on the doping concentration of region 118. For example, if doped at a relatively high hole concentration, Schottky diode 100 may have a breakdown voltage lower than if region 118 is doped at a lower hole concentration. For typical Schottky diodes, region 118 may be doped at a level providing a breakdown voltage of between 15 to 40V. However, region 118 may be doped at any suitable level to provide any suitable breakdown voltage.

As shown in FIG. 1A, region 120 is a relatively deep region substantially adjacent to electron donor doped buried layer 106, and extending from an area that is at least partially aligned with the anode to another area that is at least partially aligned with the cathode. However, as shown and described with reference to FIGS. 3A, 3B, 4A, and 4B, region 120 may be omitted or configured differently in other embodiments.

In typical semiconductor devices, the junction between an N-well and an electron donor doped buried layer may have a relatively low concentration of donor electrons (e.g., due to N-well drive-in or other process characteristics and the depth of the junction). In such devices, the lack of donor electrons in the vicinity of the N-well to electron donor doped buried layer junction typically results in a region of increased resistance as compared to the resistance of an electron donor doped buried layer or of the higher regions of the N-well.

As discussed above, region 120 has an electron concentration greater than the electron concentration of bulk 112 and may be configured to reduce a forward voltage drop of Schottky diode 100 as compared to Schottky diodes without a similar region. Region 120 may also help define a relatively low resistance path to electron donor doped buried layer 106 from anode 102 and from layer 106 to cathode 104 by improving current flow and reducing resistance between bulk 112 and layer 106.

Region 120 may be formed by implantation of phosphorous with an implant flux in the range of $5 \times 10^{11}/cm^2$ to $5 \times 10^{12}/cm^2$, and with an energy in the range of 600 KeV to 2 MeV. In one embodiment, region 120 is implanted at a depth of approximately 2 to 3 uM. However, region 120 may be doped with any other suitable dopant (e.g., arsenic), with any suitable process, and at any suitable depth.

As shown in FIG. 1A, region 122 is a relatively shallow region substantially adjacent to anode 102. As also discussed briefly above, region 122 has an electron concentration that is less than that of bulk 112. However, as shown and described with reference to FIGS. 2A, 2B, 3A, and 3B, region 122 may be omitted in other embodiments. Likewise, region 122 may be configured differently in yet other embodiments.

In one embodiment, region 122 may be doped with hole donors so that, although region 122 is still overall an N-type semiconductor, its electron concentration is less than that of bulk 112. In this way, region 122 may reduce the electron concentration at the surface of N-well 110 thereby providing resistance between anode 102 and N-well 110. This resistance may reduce a reverse leakage current of Schottky diode 100 as compared to Schottky diodes without a similar region.

Region 122 may be formed by implantation of boron with an implant flux in the range of $5 \times 10^{11}/cm^2$ to $5 \times 10^{12}/cm^2$, and with an energy in the range of 20 KeV to 50 KeV. However, region 120 may be doped with any other suitable dopant (e.g., boron fluoride, etc.) or through any other suitable process (e.g., diffusion, oxidation-reduction, etc).

FIGS. 2A, 2B, 3A, 3B, 4A, and 4B, are respective illustrations of cross section and plan views of Schottky diodes 200, 300, and 400. Schottky diodes 200, 300, and 400 are described with respect to the differences from Schottky diode 100 of FIGS. 1A and 1B.

Figure 2A:
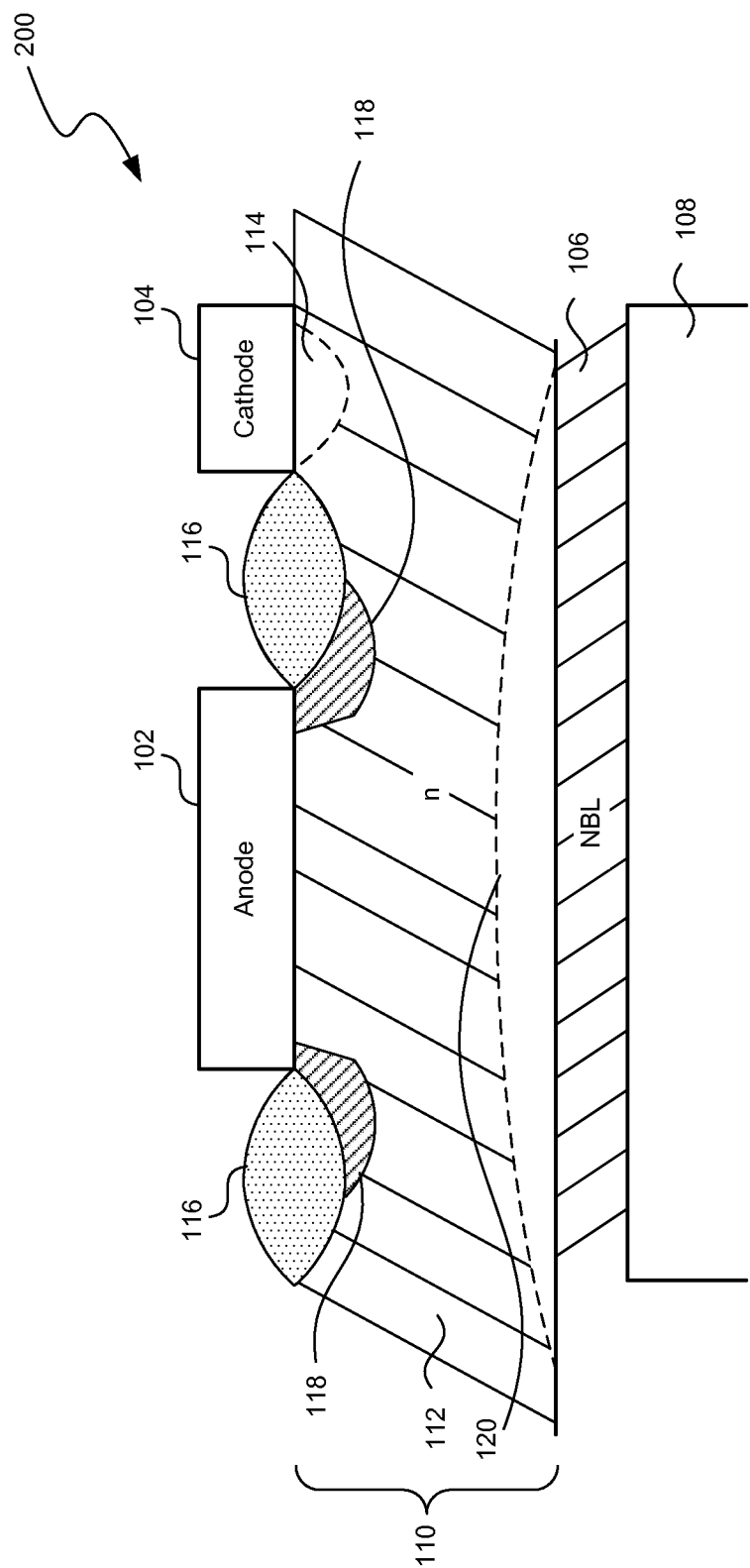
Figure 2B:
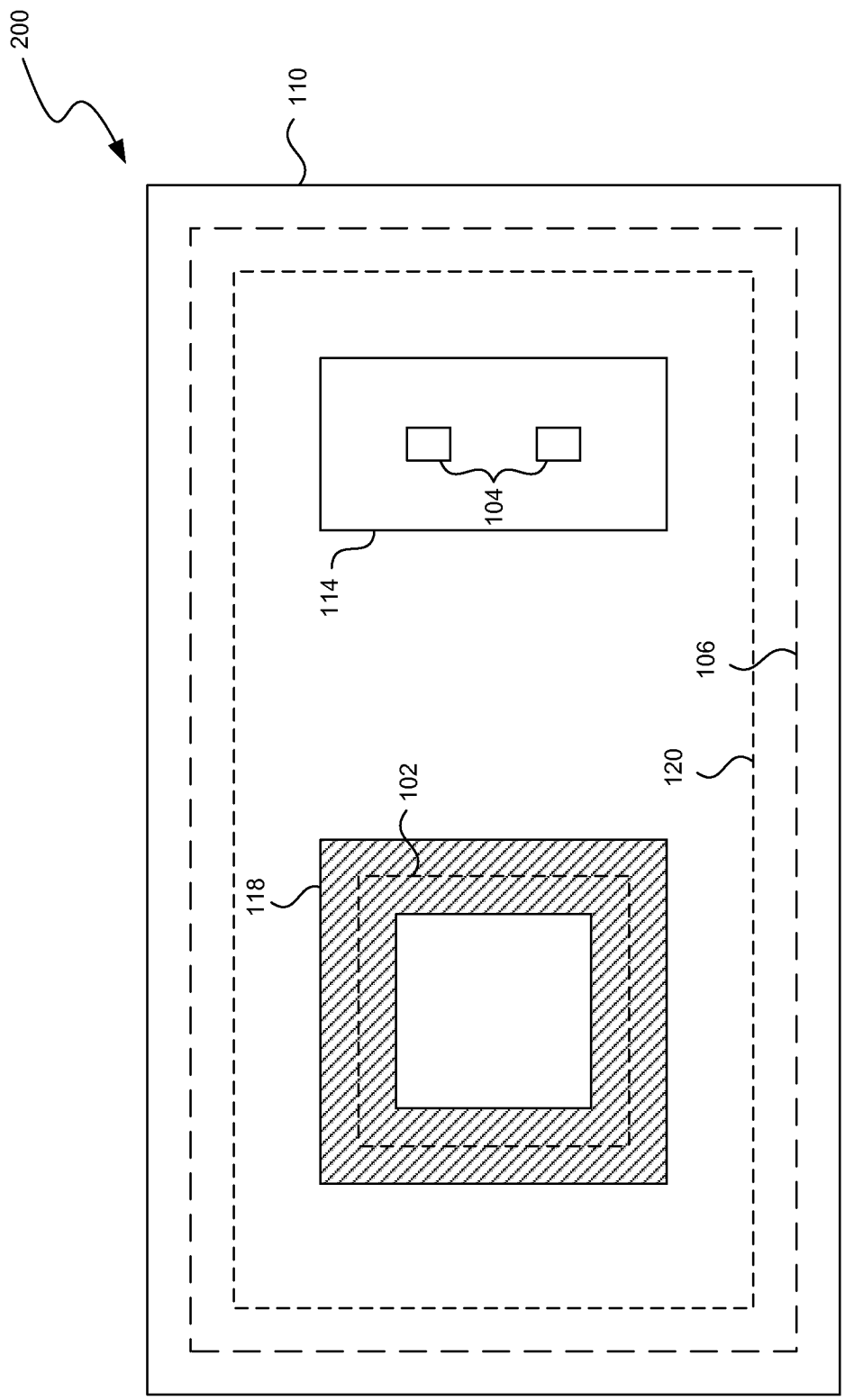

Schottky diode 200 of FIGS. 2A and 2B omits region 122 and may have a lower forward voltage drop but higher reverse leakage current than Schottky diode 100.

Figure 3A:
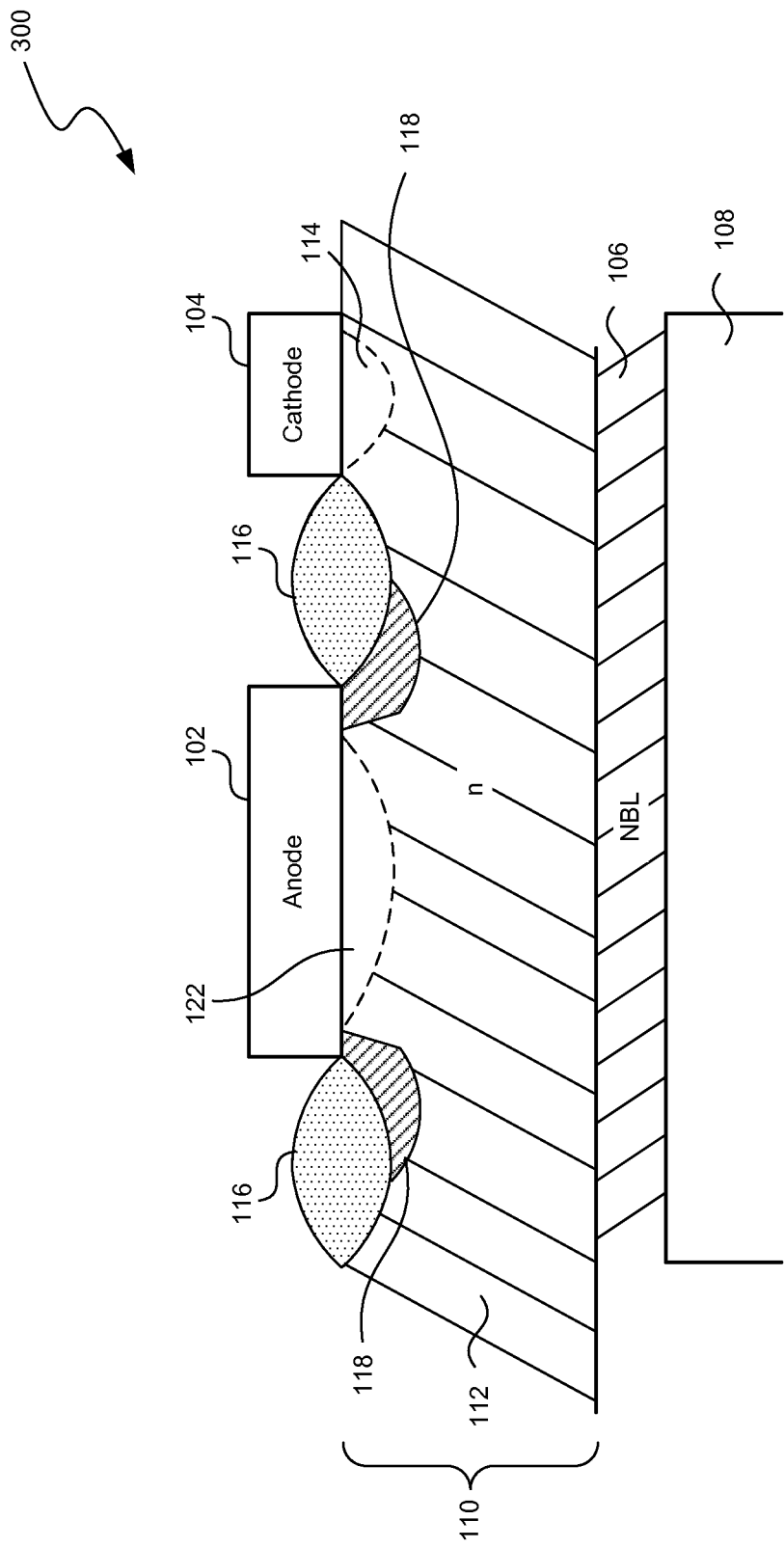
Figure 3B:
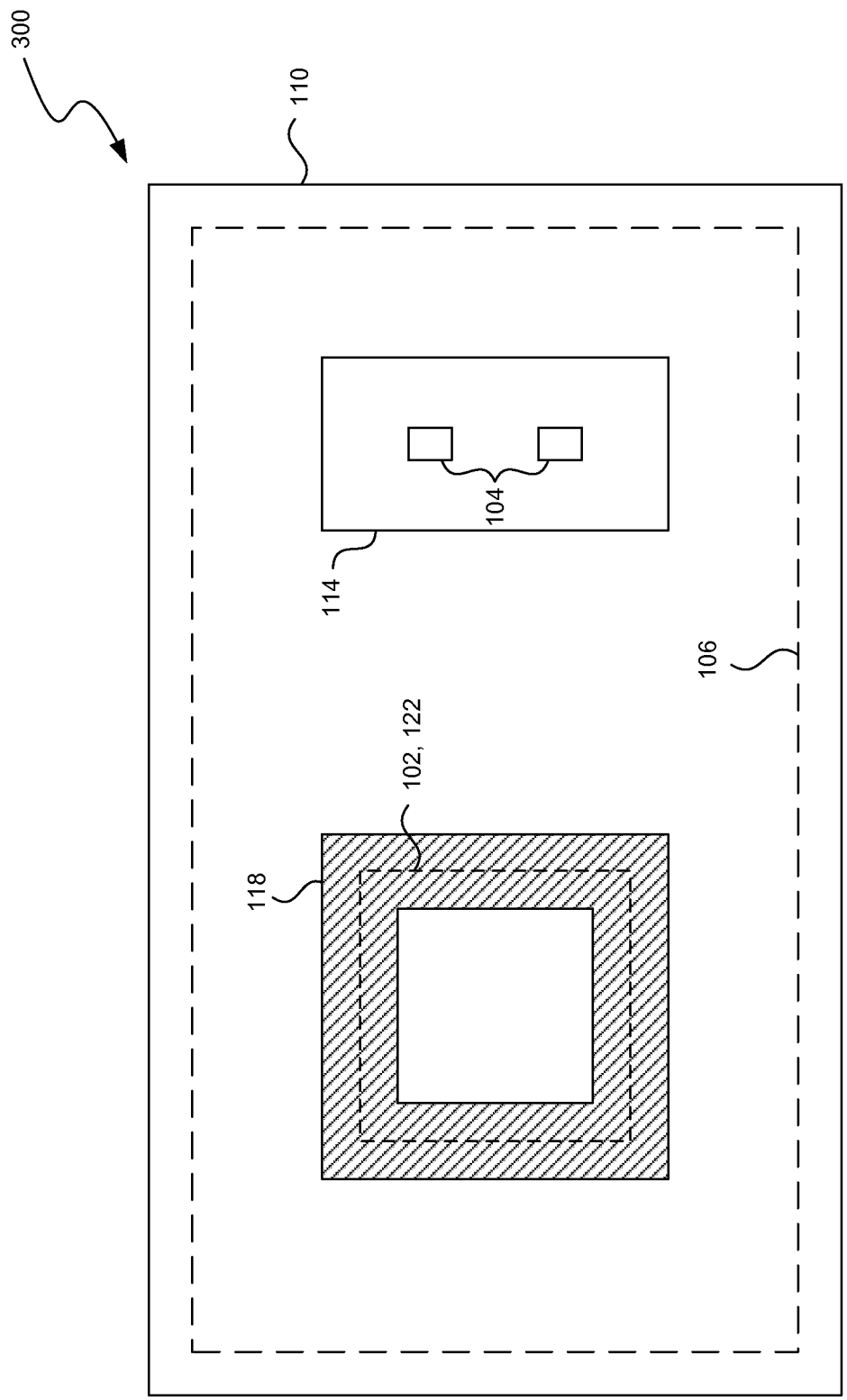

Schottky diode 300 of FIGS. 3A and 3B omits region 120 and may have a higher forward voltage drop but lower reverse leakage current than Schottky diode 100.

Figure 4A:
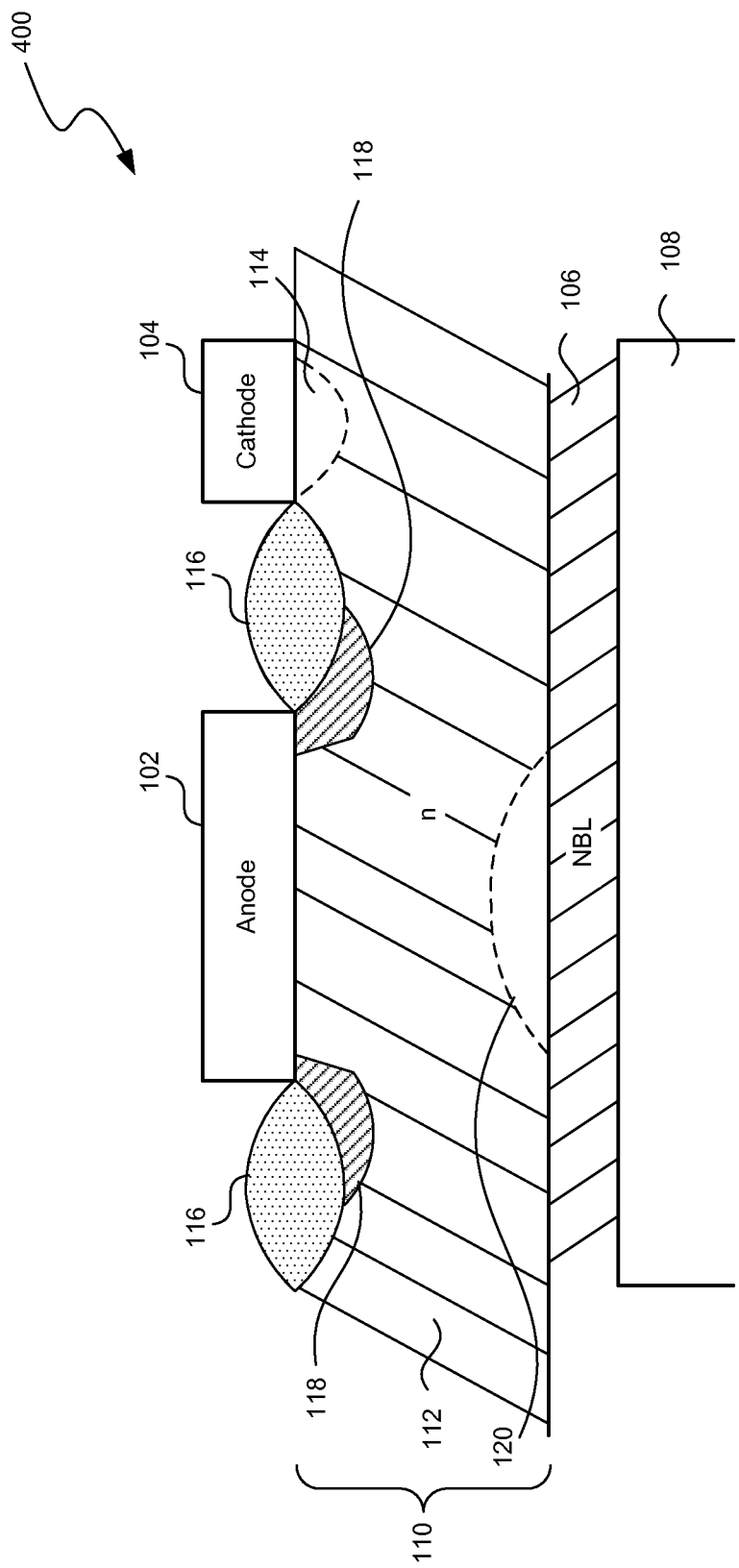
Figure 4B:
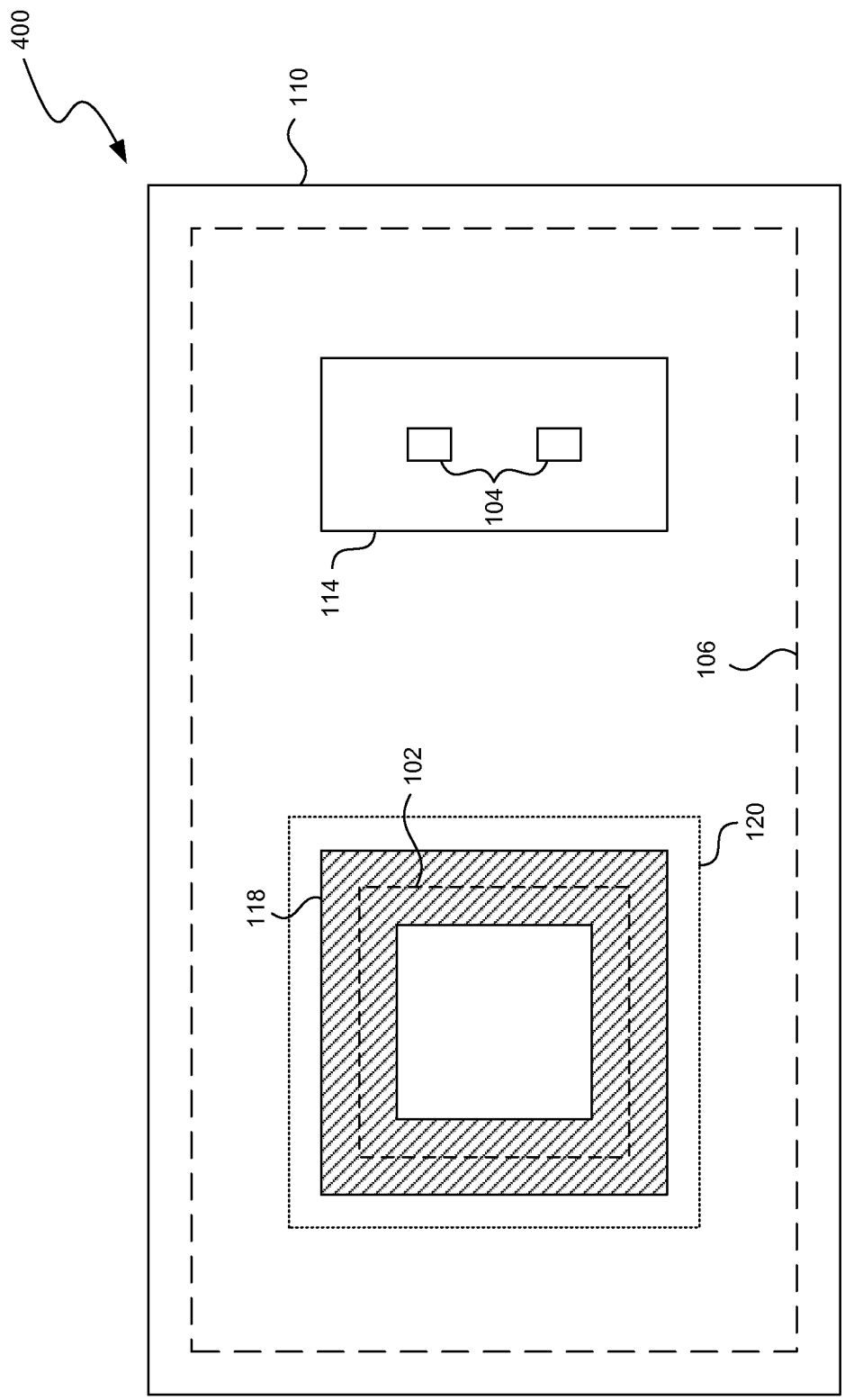

Schottky diode 400 of FIGS. 4A and 4B includes region 120 as a relatively deep region substantially adjacent to electron donor doped buried layer 106 in an area that is at least partially aligned with the anode. As compared to region 120 of Schottky diode 100 and Schottky diode 200, region 120 of Schottky diode 400 may provide less reduction of forward voltage drop.

FIGS. 5A-5L illustrate a method of manufacturing Schottky diode 100 of FIG. 1A-1B.

Figure 5A:
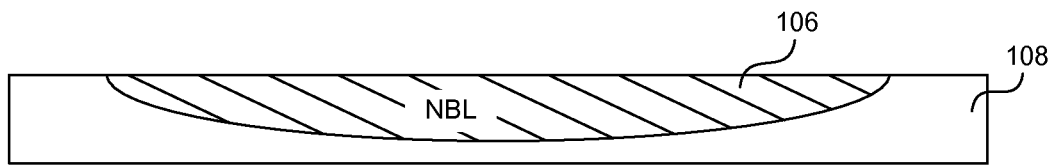
FIGS. 5A-5L illustrate a method of manufacturing the Schottky diode of FIG. 1A-1B according to an embodiment of the invention.

As shown in FIG. 5A, after starting with a suitable substrate 108, electron donor doped buried layer 106 is formed into, or onto, substrate 108. For example, forming electron donor doped buried layer 106 may include implanting donor electrons such as phosphorus donor electrons through an implantation process such as discussed above with reference to FIGS. 1A and 1B. Forming electron donor doped buried layer 106 may also include a drive-in of donor electrons into substrate 108.

Figure 5B:
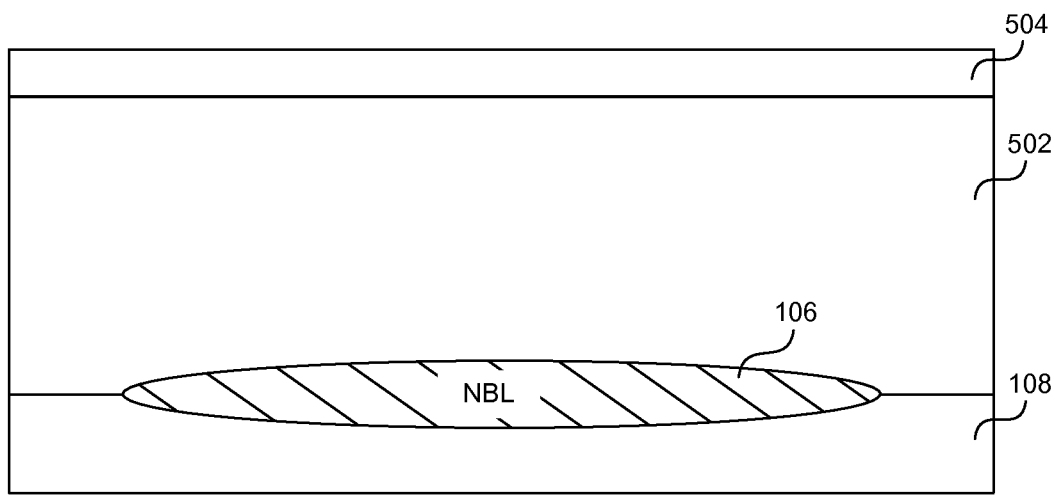

Referring to FIG. 5B, N-type epitaxial layer 502 is then formed over electron donor doped buried layer 106 and substrate 108 before the wafer is oxidized to form pad oxide layer 504.

Figure 5C:
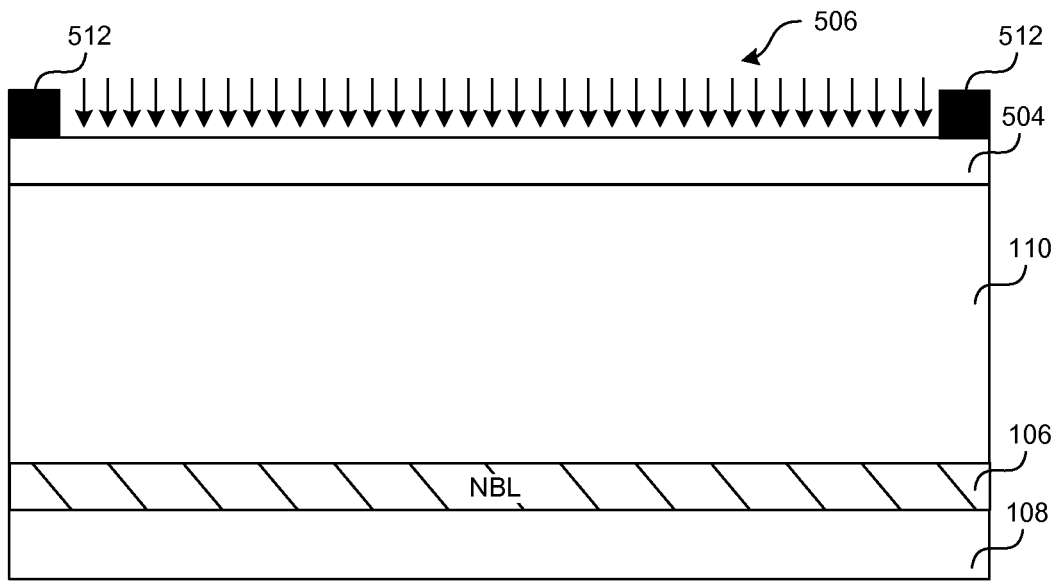

As shown in FIG. 5C, photoresist 512 is added and, for example, phosphorous is implanted via an implant process, as discussed above and as shown by arrows 506, to form N-well 110. However, in other embodiments, other processes may be performed instead of the process shown in FIGS. 5B and 5C. For example, N-type epitaxial layer 502 may be suitably formed with an appropriate donor electron concentration and be employed instead of N-well 110 for later steps.

Figure 5D:
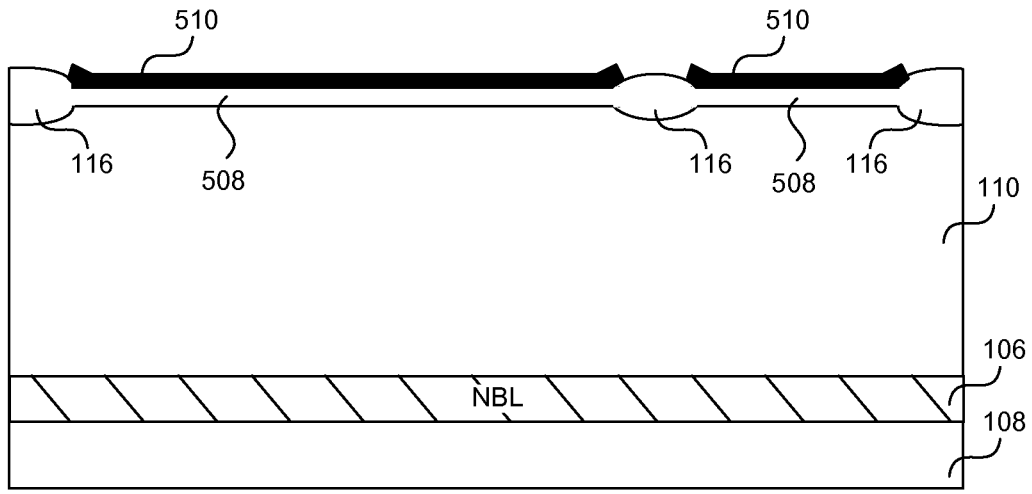

Referring to FIG. 5D, which shows an active/field oxidation step, pad oxide layer 504 and the photoresist of FIG. 5C are removed. Then, active pad oxide 508 is grown over N-well 110. Then, nitride 510 is deposited and etched using an active mask. After a nitride etch, field oxidation is performed to form field oxide 116 over N-well 110.

Figure 5E:
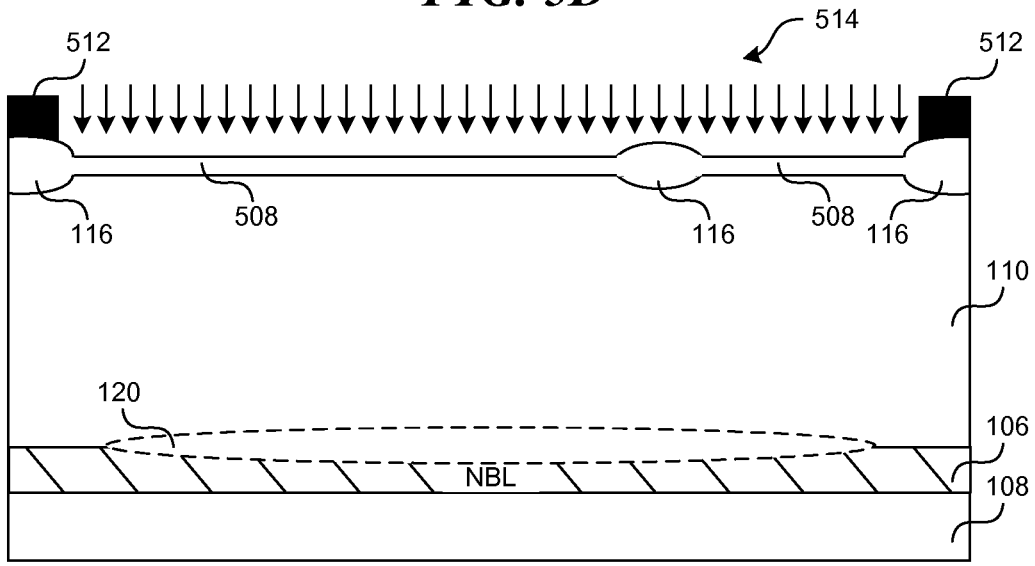

As shown in FIG. 5E, nitride 510 is removed, photoresist 512 is selectively placed onto the wafer, e.g., via photolithography, and region 120 is implanted as shown by arrows 514. As discussed above, high energy ion implantation of phosphorous may be employed to form region 120 with a donor electron concentration greater than that of bulk 112 (not shown in FIG. 5E). As discussed above, this may include implanting phosphorous with an implant flux in the range of $5 \times 10^{11}/cm^2$ to $5 \times 10^{12}/cm^2$, and with an energy in the range of 600 KeV to 2 MeV. Region 120 may be implanted at a depth of approximately 2 to 3 uM.

Figure 5F:
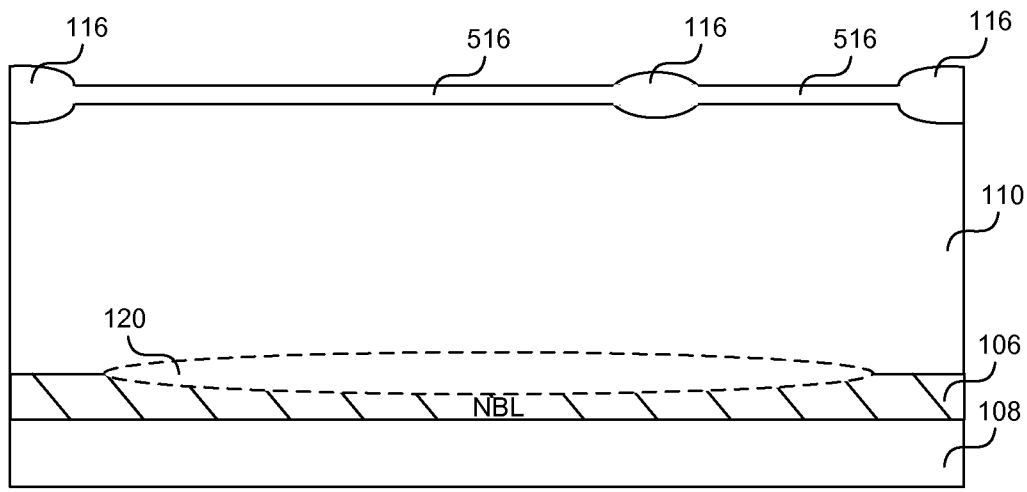

At FIG. 5F, photoresist 512 and active pad oxide 508 are then removed and gate oxidation is performed to form gate oxide 516.

Figure 5G:
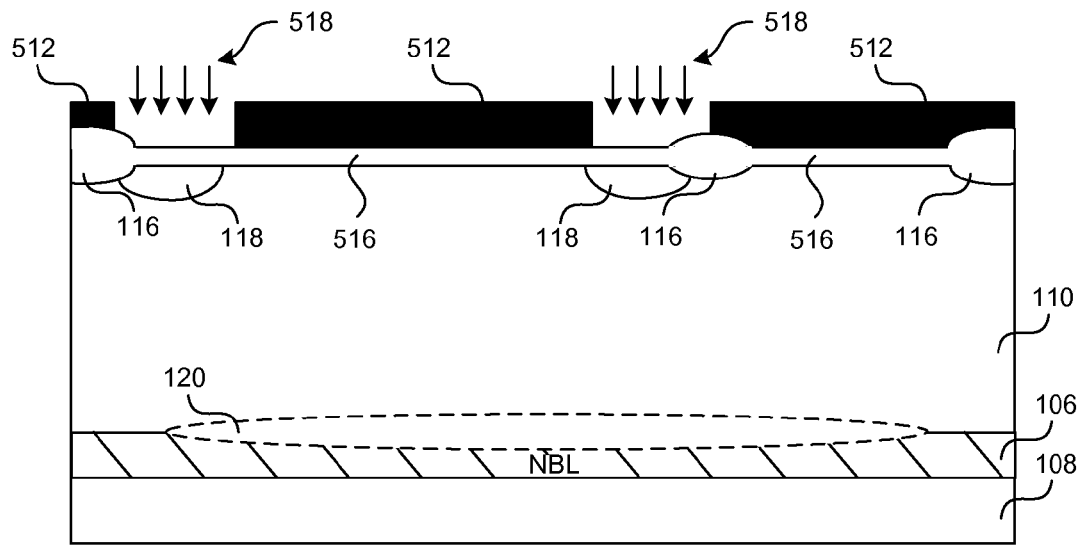

As shown in FIG. 5G, photoresist 512 is applied and region 118 is implanted as illustrated by arrows 518. As discussed above, region 118 may include a relatively lightly doped P+, P-base or P-well formed as a guardring to later surround anode 102.

Figure 5H:
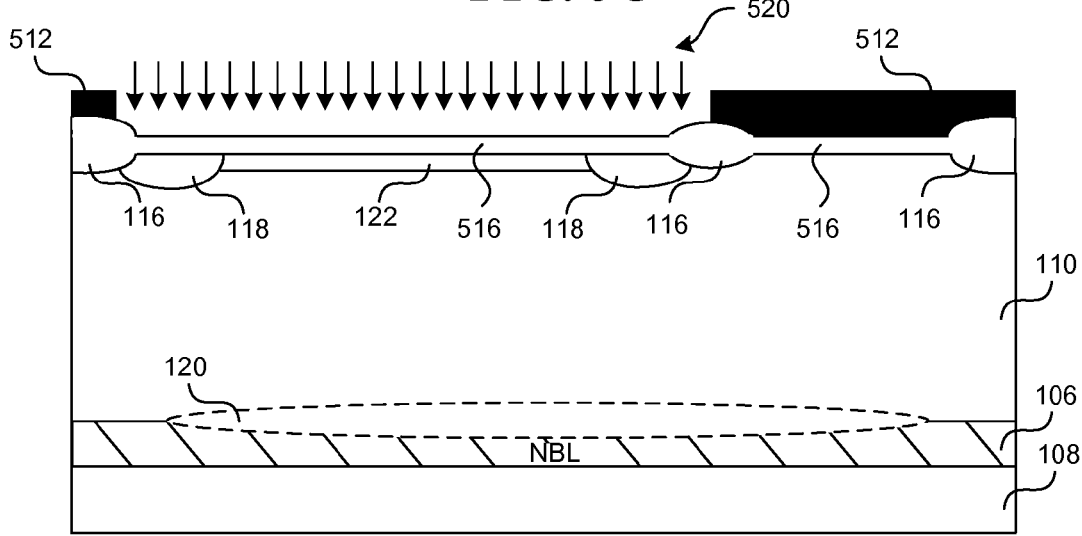

Referring now to FIG. 5H, the photoresist of FIG. 5G is removed, new photoresist 512 is formed, and region 122 is implanted, as illustrated by arrows 520. As shown in FIG. 5H, region 122 may be implanted to have a donor electron concentration less than that of bulk 112 and at a location that will later be substantially adjacent to (e.g., under) anode 102. As discussed above, implanting region 122 may include implanting boron into region 122 with an implant flux in the range of $5 \times 10^{11}/cm^2$ to $5 \times 10^{12}/cm^2$, and with an energy in the range of 20 KeV to 50 KeV.

Figure 5I:
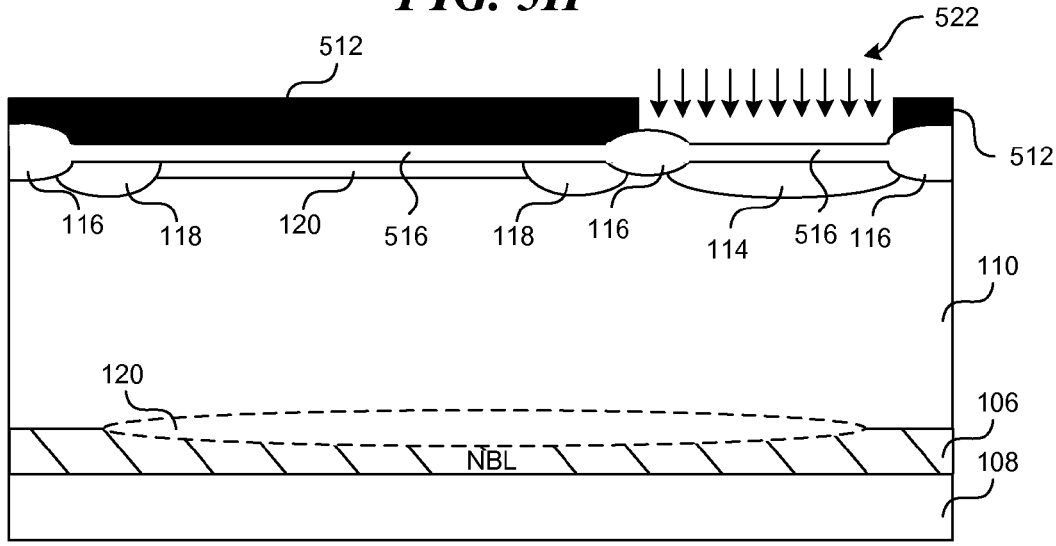

Moving now to FIG. 5I, the photoresist 512 of FIG. 5H is removed, new photoresist 512 is formed, and N+ region 114 is implanted into N-well 110 with a donor electron concentration greater than that of bulk 112, as shown by arrows 522. As shown by FIG. 5I, N+ region 114 is implanted at a location that will later be substantially adjacent to (e.g., under) cathode 104.

Figure 5J:
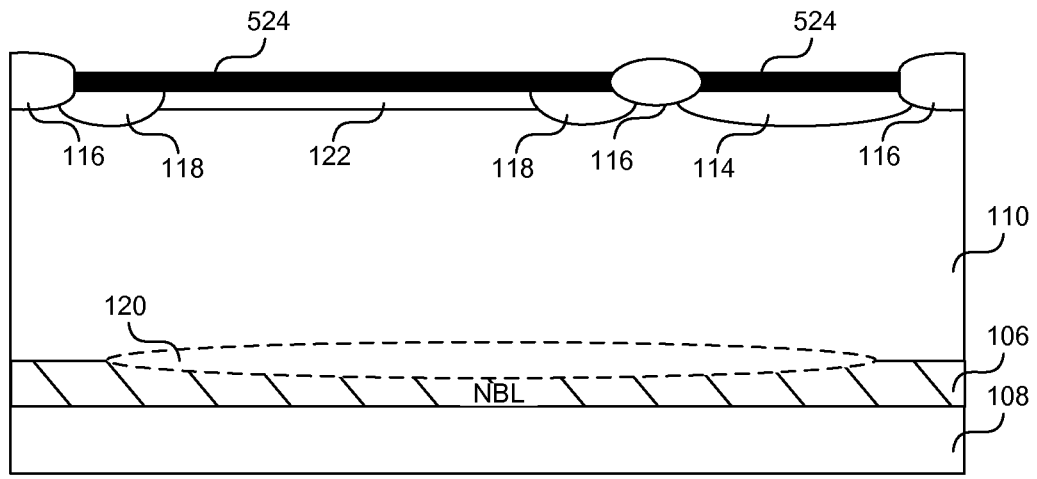
Figure 5K:
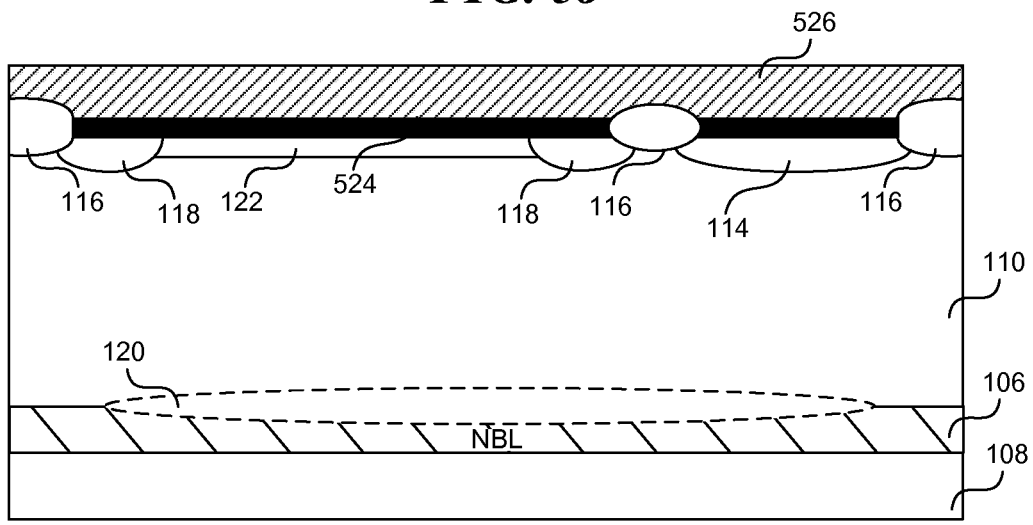
Figure 5L:
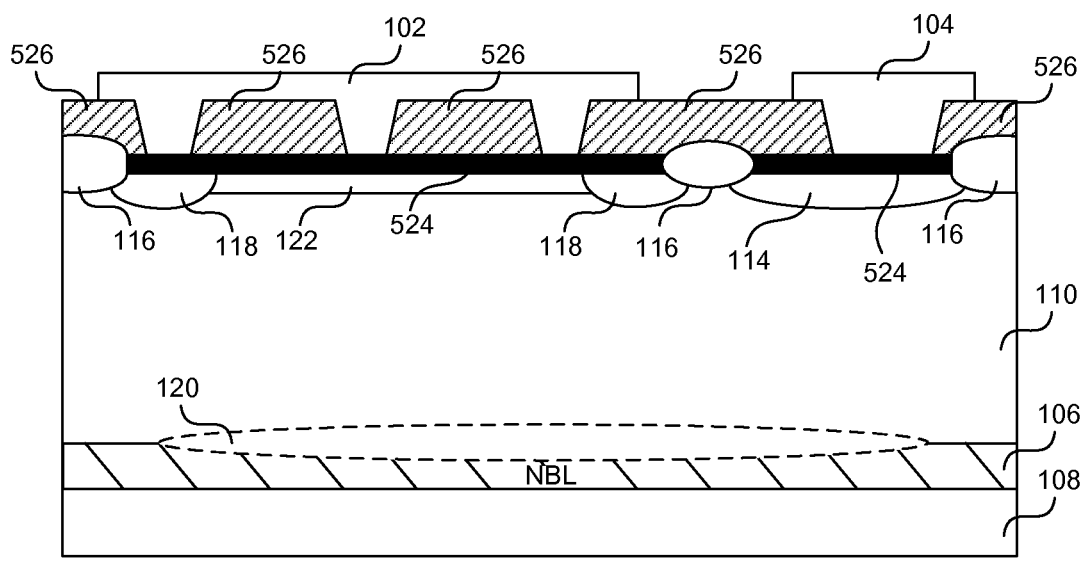

As shown in FIGS. 5J-5L, anode 102 and cathode 104 are then formed. At FIG. 5J, salicide 524 is formed on open active regions via a salicidation process. As one example, the salicidation process may be a Ti salicidation process, a Ti/TiN salicidation process, a cobalt salicidation process, and/or the like. As shown in FIG. 5K, inter-level-dielectric material 526 (e.g. tetraethyl orthosilicate (TEOS), borophosphosilicate glass (BPSG), etc) is deposited before forming contacts and performing a metallization process. (As shown in FIG. 5L, contacts are formed and a metallization process is performed to form anode 102 and cathode 104.

FIGS. 6A-6M illustrate a method of manufacturing another embodiment of a Schottky diode according to another embodiment of the invention. The method of FIGS. 6A-6M is described below with respect to the differences from the method of FIGS. 5A-5L.

The processes and/or steps represented by FIGS. 6A-6I may be substantially similar to the processes and/or steps respectively represented by FIGS. 5A-5I. However, with respect to FIGS. 6D-6I, different masking and/or photoresist patterns may be employed.

Figure 6A:
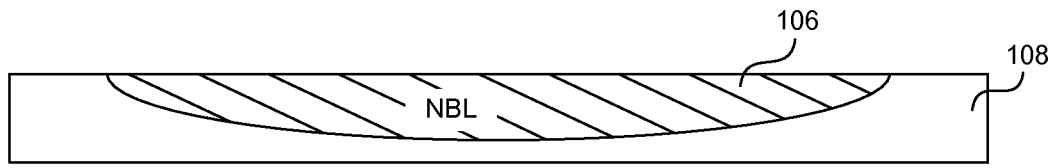
FIGS. 6A-6M illustrate a method of manufacturing another embodiment of a Schottky diode according to another embodiment of the invention.
Figure 6B:
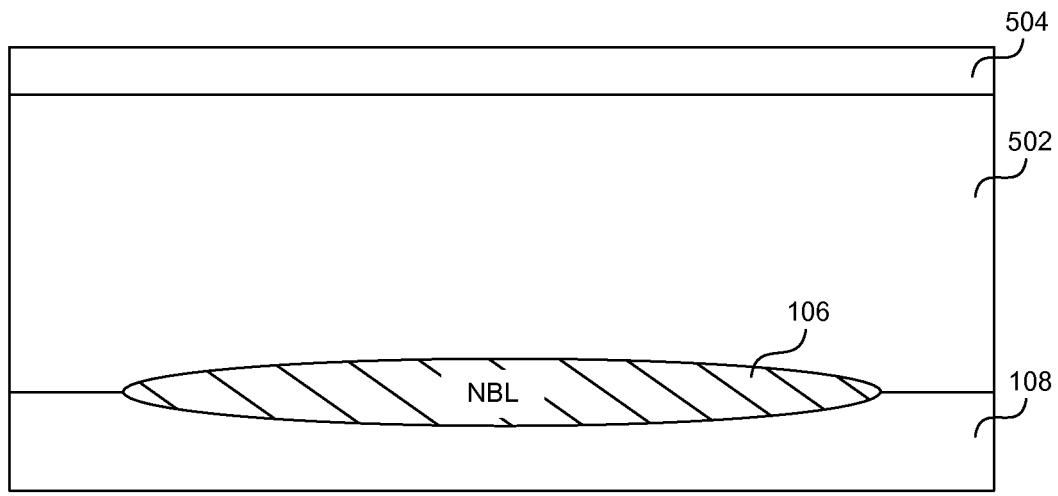
Figure 6C:
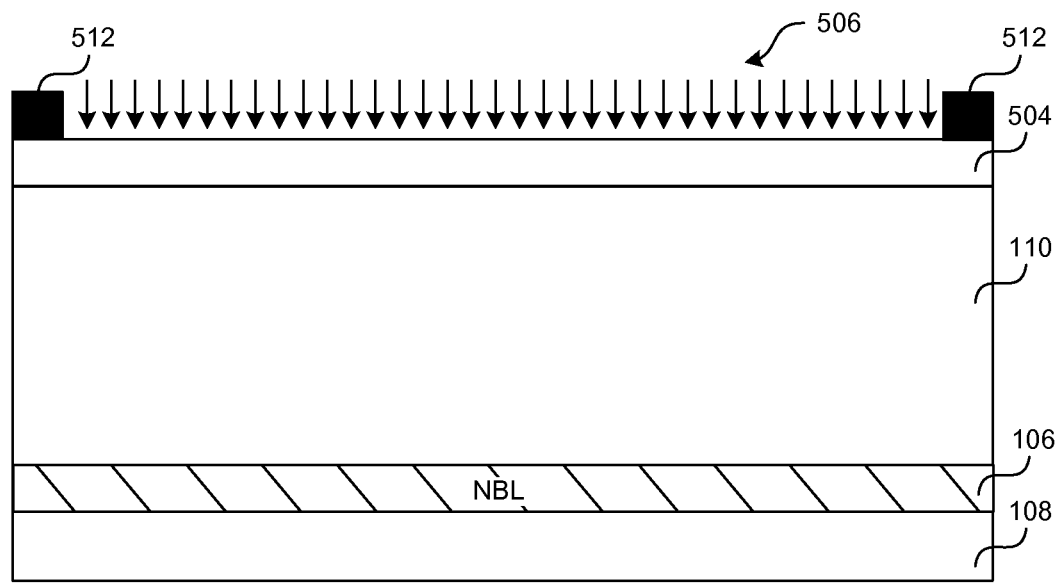
Figure 6D:
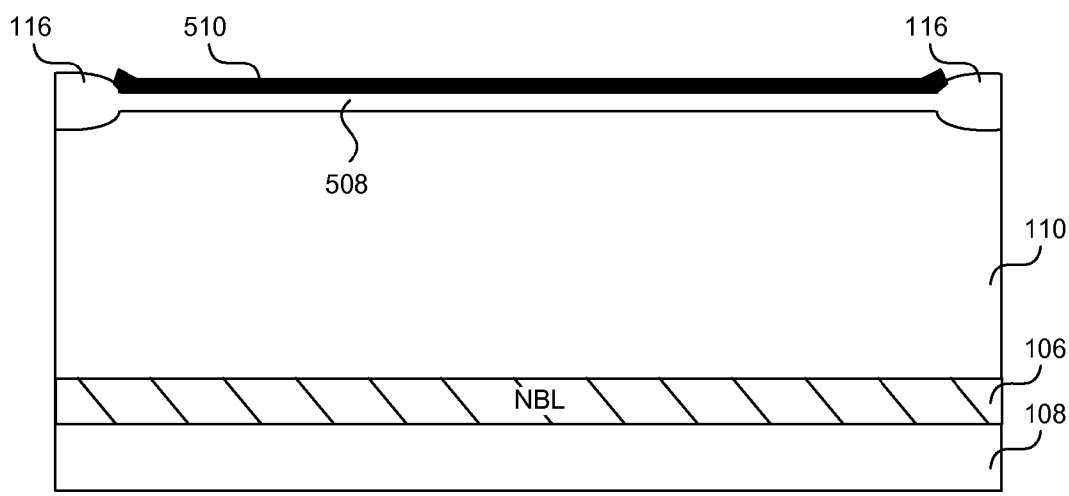
Figure 6E:
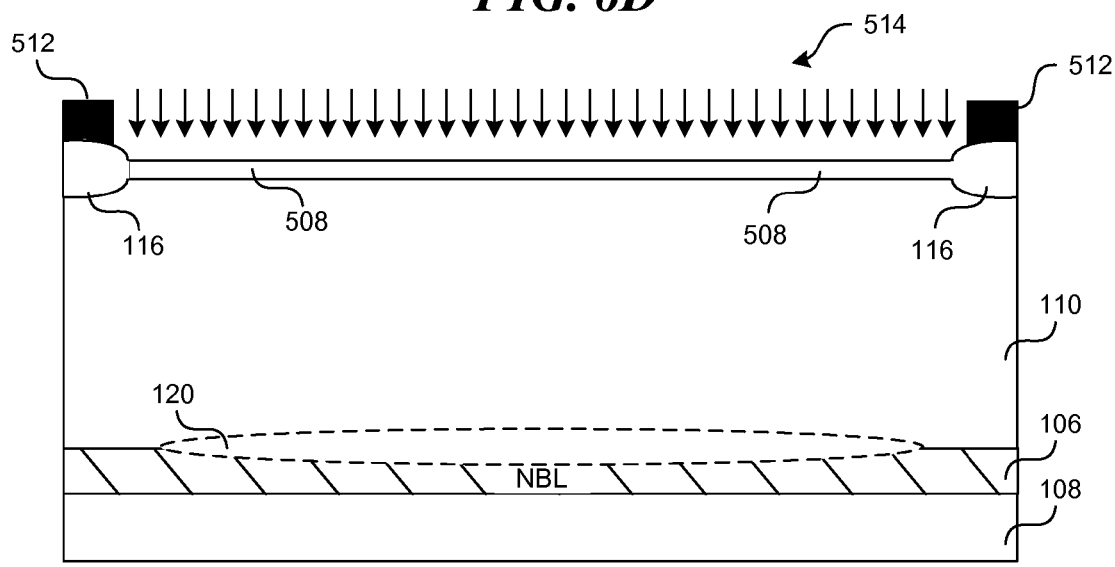
Figure 6F:
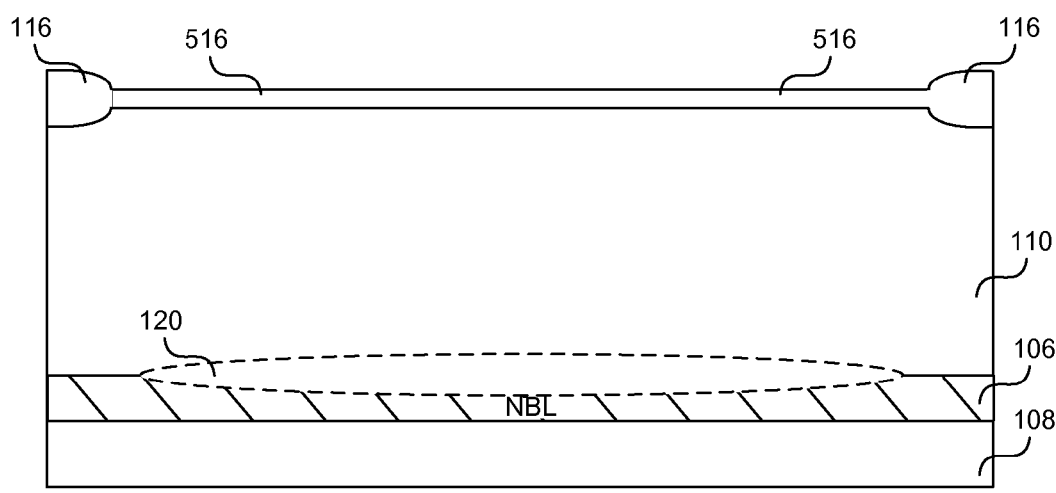
Figure 6G:
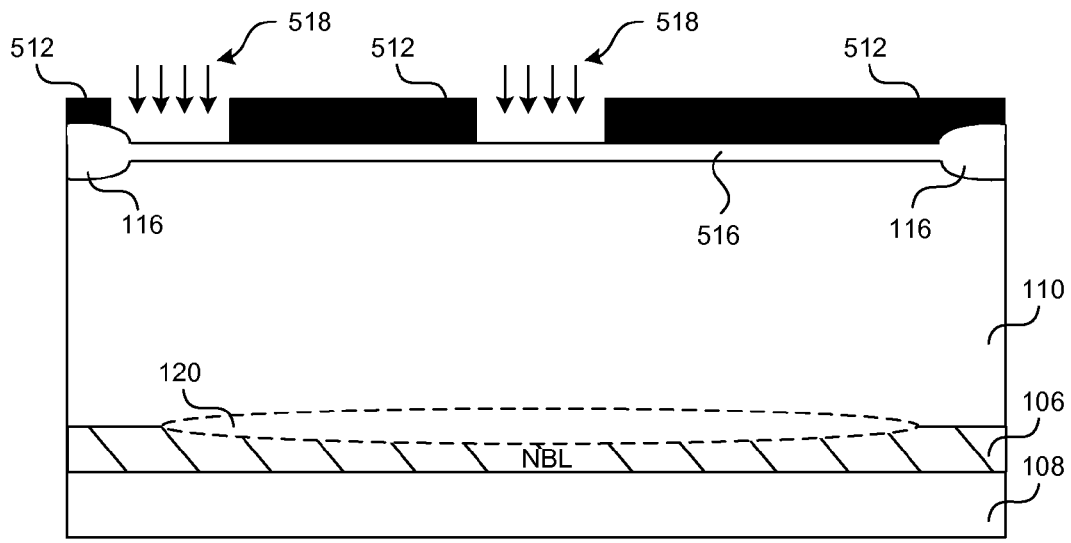
Figure 6H:
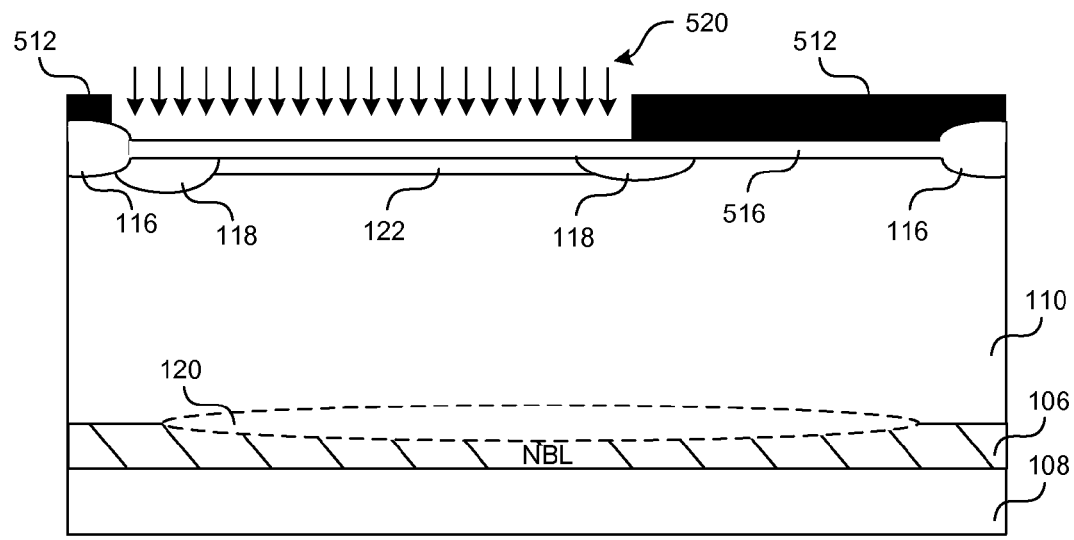
Figure 6I:
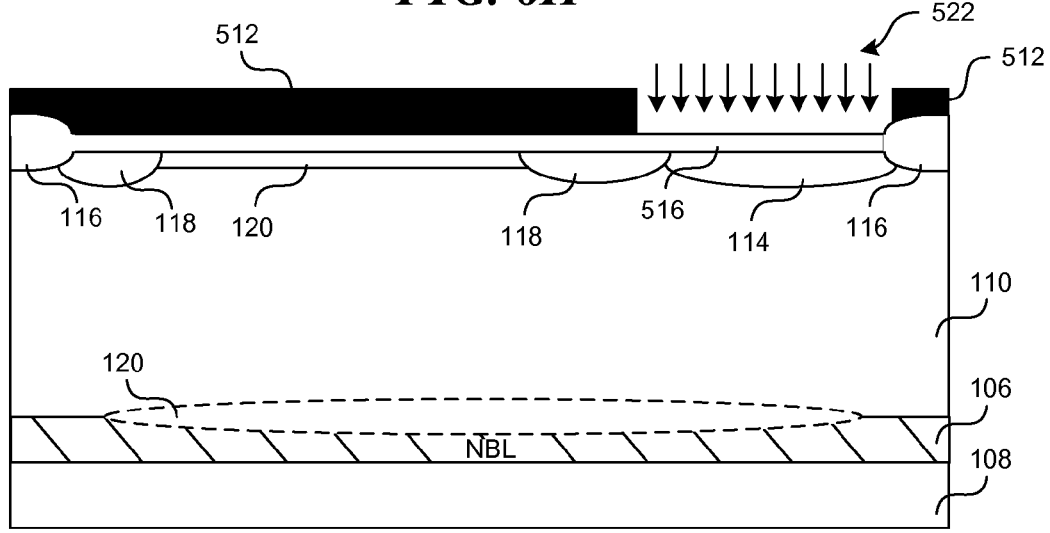
Figure 6J:
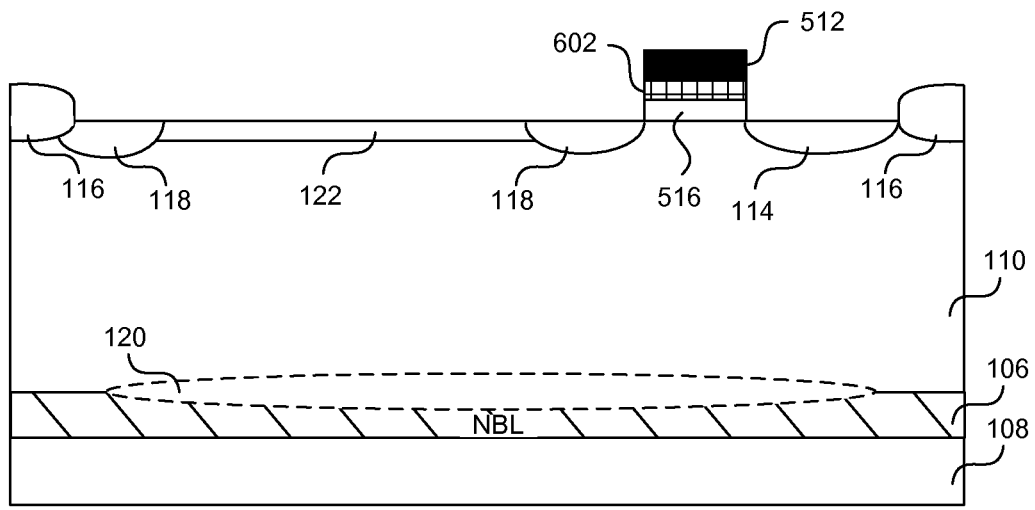

Referring now to FIG. 6J, silicide block oxide 602 is deposited over the wafer, photoresist 512 is formed as shown, and an oxide etch is performed to result in the depicted remaining silicide block oxide 602.

Figure 6K:
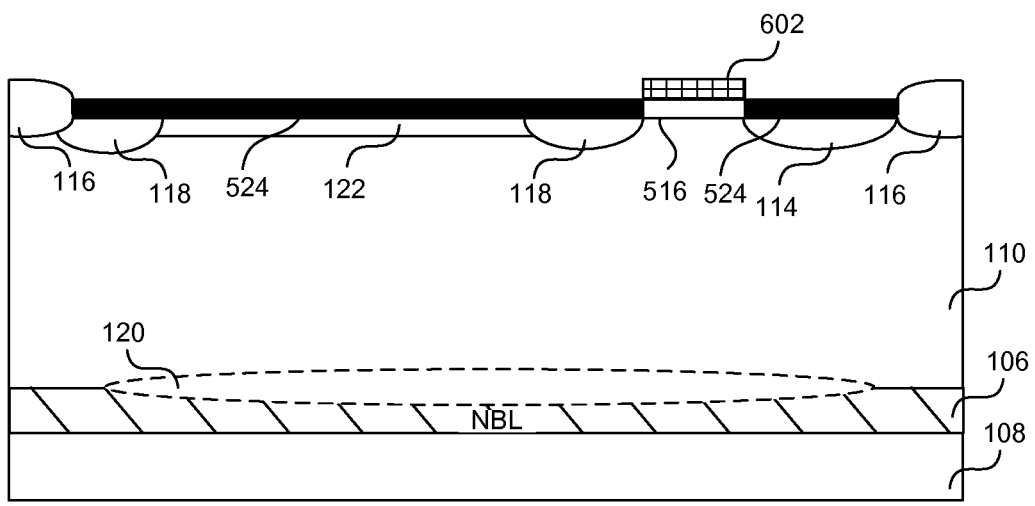
Figure 6L:
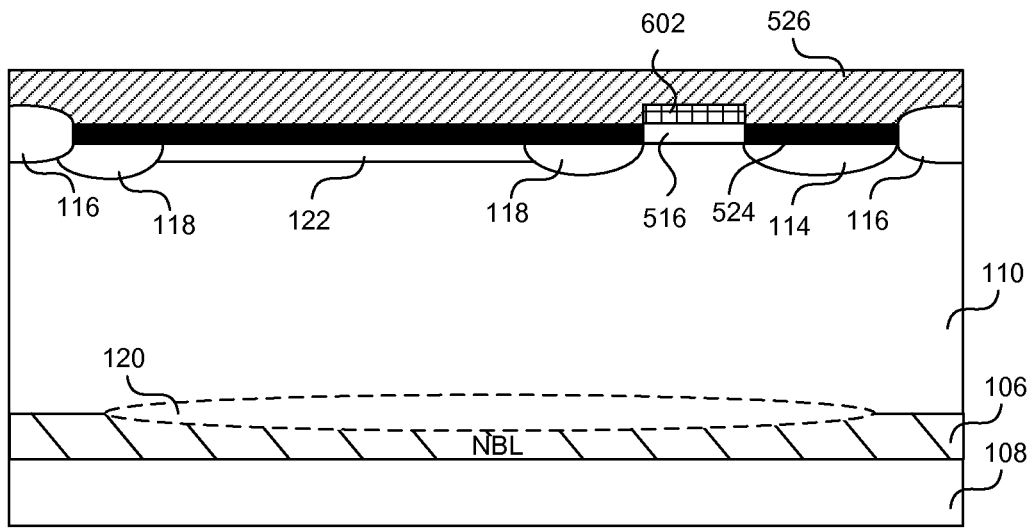
Figure 6M:
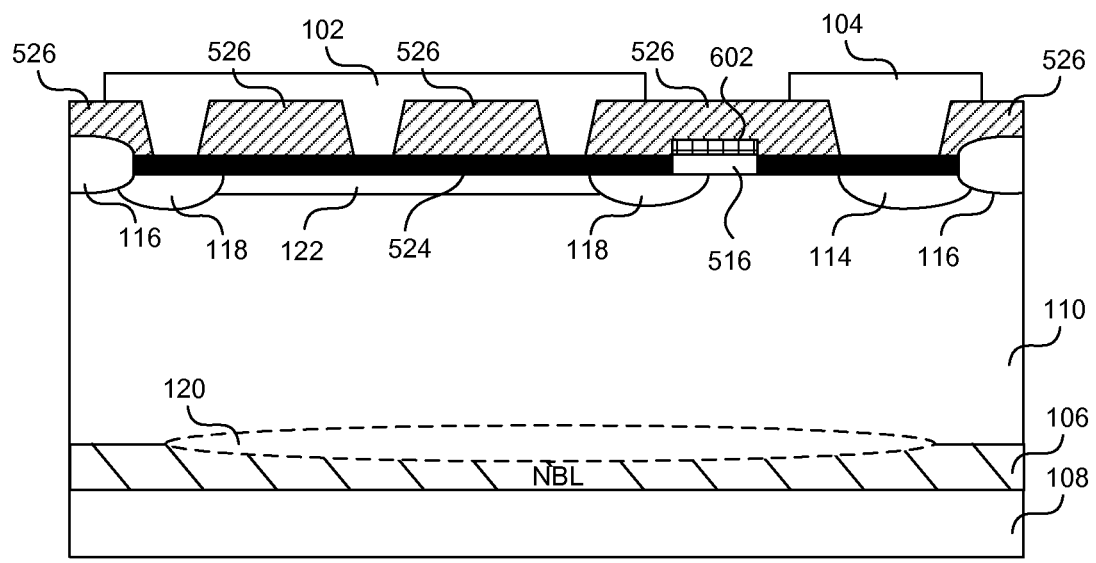

Following the processes and/or steps represented by FIG. 6J, photoresist 512 may be removed and processes and/or steps substantially similar to the processes and/or steps respectively represented by FIGS. 5J-5L, albeit with different masking and/or photoresist patterns, may be employed to represent processes and/or steps represented by FIGS. 6K-6M.

While the above Detailed Description describes certain embodiments of the invention, and describes the best mode contemplated, no matter how detailed the above appears in text, the invention can be practiced in many ways. Details of the system may vary in implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description explicitly defines such terms. Accordingly, the actual scope of the invention encompasses not only the disclosed embodiments, but also all equivalent ways of practicing or implementing the invention under the claims.

We claim:

1. A Schottky diode, comprising:
an electron donor doped buried layer;

an anode;
a cathode; and
an N-well or N-type epitaxial layer including:
　　a first region having a donor electron concentration;
　　a second region substantially adjacent to the electron doped buried layer and having a donor electron concentration that is greater than that of the first region, wherein the second region includes implanted phosphorus donor electrons; and
　　an N-type third region substantially adjacent to the anode and having a donor electron concentration that is less than that of the first region, wherein the third region includes boron.

2. The Schottky diode of claim 1, wherein the second region is configured to reduce a resistance of the Schottky diode.

3. The Schottky diode of claim 1, wherein the third region is configured to reduce a reverse leakage current of the Schottky diode.

4. The Schottky diode of claim 1, wherein the anode and the cathode each include at least one of titanium, titanium nitride, or cobalt.

5. The Schottky diode of claim 1, wherein the N-well or N-type epitaxial layer further includes:
　　a fourth region substantially adjacent to the cathode and having a donor electron concentration greater than that of the first region;
　　a dielectric field oxide region formed in an annular configuration around the anode; and
　　a P-type region formed in an annular configuration around the anode, wherein a breakdown voltage is based on a doping of the P-type region.

6. The Schottky diode of claim 1, wherein the boron was implanted with a flux in the range of $5 \times 10^{11}/cm^2$ to $5 \times 10^{12}/cm^2$, and with an energy in the range of 20 KeV to 50 KeV, and wherein the implanted phosphorus donor electrons were implanted with a flux in the range of $5 \times 10^{11}/cm^2$ to $5 \times 10^{12}/cm^2$, and with an energy in the range of 600 KeV to 2 MeV.

7. The Schottky diode of claim 1, wherein the second region extends from an area that is at least partially aligned with the anode to another area that is at least partially aligned with the cathode.

8. A Schottky diode comprising:
an electron donor doped buried layer;
an anode;
a cathode; and
an N-well or N-type epitaxial layer including:
　　a first region having a first donor electron concentration; and
　　either (a) a relatively deep region substantially adjacent to the electron doped buried layer and having a donor electron concentration greater than the first donor electron concentration, and (b) an N-type relatively shallow region substantially adjacent to the anode and having a donor electron concentration less than the first donor electron concentration;
　　or only (b).

9. The Schottky diode of claim 8, wherein the N-well or N-type epitaxial layer includes the relatively deep region, and wherein the relatively deep region includes implanted phosphorus donor electrons.

10. The Schottky diode of claim 8, wherein the N-well or N-type epitaxial layer includes the relatively shallow region, and wherein the relatively shallow region includes implanted boron.

11. The Schottky diode of claim 8, wherein the N-well or N-type epitaxial layer includes both the relatively deep region and the relatively shallow region, wherein the relatively deep region includes implanted phosphorus donor electrons, and wherein the relatively shallow region includes implanted boron.

12. The Schottky diode of claim 11, wherein the implanted phosphorus donor electrons were implanted with a flux in the range of $5 \times 10^{11}/cm^2$ to $5 \times 10^{12}/cm^2$, and with an energy in the range of 600 KeV to 2 MeV, and wherein the implanted boron were implanted with a flux in the range of $5 \times 10^{11}/cm^2$ to $5 \times 10^{12}/cm^2$, and with an energy in the range of 20 KeV to 50 KeV.

13. The Schottky diode of claim 8, wherein the anode and cathode are each formed from a low barrier height metal.

14. The Schottky diode of claim 8, wherein the N-well or N-type epitaxial layer further includes:
　　a second relatively shallow region substantially adjacent to the cathode and having a donor electron concentration greater than the first donor electron concentration; and
　　a P-type region in an annular configuration around the anode.

15. The Schottky diode of claim 14, wherein a breakdown voltage of the Schottky diode is based on a doping of the P-type region, and wherein the P-type region includes at least one of a P-base or a P-well.

16. The Schottky diode of claim 8, wherein the N-well or N-type epitaxial layer further includes:
　　a dielectric field oxide in an annular configuration around the anode.

* * * * *